United States Patent
Tanaka et al.

[11] Patent Number: 5,089,861
[45] Date of Patent: Feb. 18, 1992

[54] SEMICONDUCTOR LASER DEVICE WITH MOUNTING BLOCK

[75] Inventors: Haruo Tanaka, Shiga; Tetsuichi Inoue, Kyoto, both of Japan

[73] Assignee: Rohm Co., Ltd., Kyoto, Japan

[21] Appl. No.: 686,152

[22] Filed: Apr. 16, 1991

[30] Foreign Application Priority Data

May 9, 1990 [JP] Japan .................................. 2-120575
May 9, 1990 [JP] Japan .................................. 2-120576

[51] Int. Cl.$^5$ .......................................... H01L 33/00
[52] U.S. Cl. ........................................ 357/17; 357/74; 357/75; 357/19; 250/211 J
[58] Field of Search ................. 357/74, 72, 17, 19, 357/75, 76, 79, 74 R, 74 A, 74 B, 74 C, 74 F, 30 G, 30 R, 81; 250/211 J

[56] References Cited

U.S. PATENT DOCUMENTS

| | | | |
|---|---|---|---|
| 4,338,577 | 7/1982 | Sato et al. | 357/74 X |
| 4,366,492 | 12/1982 | Kitamura | 357/74 X |
| 4,403,243 | 9/1983 | Hakamada et al. | 357/74 |
| 4,733,067 | 3/1988 | Oinoue et al. | 250/211 J X |
| 4,768,070 | 8/1988 | Takizawa et al. | 357/17 |
| 4,945,391 | 7/1990 | Yagoura et al. | 357/19 |
| 4,953,171 | 8/1990 | Nakajima et al. | 357/74 X |
| 4,959,761 | 9/1990 | Critelli et al. | 357/74 X |

FOREIGN PATENT DOCUMENTS 62-58066  4/1987  Japan .

Primary Examiner—William Mintel
Attorney, Agent, or Firm—William H. Eilberg

[57] ABSTRACT

The present invention provides a semiconductor laser device which comprises a metallic stem, a cap mounted to one surface of the stem, a mounting block arranged to project from the one surface of the stem into the cap, and a semiconductor laser chip by the mounting block. The stem comprises a first stem member and a second member joined to the first stem member in lamination thereto. The first stem member is formed with a cutting line partially surrounding a portion of the first stem member. The mounting block is provided by bending the partially surrounded portion into the cap to leave a corresponding perforation in the first stem member.

9 Claims, 3 Drawing Sheets

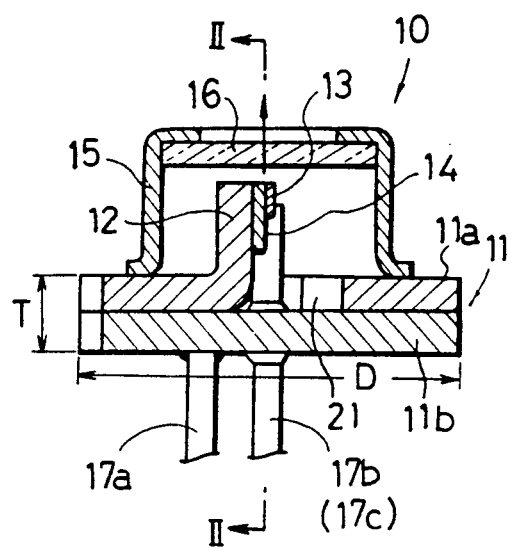
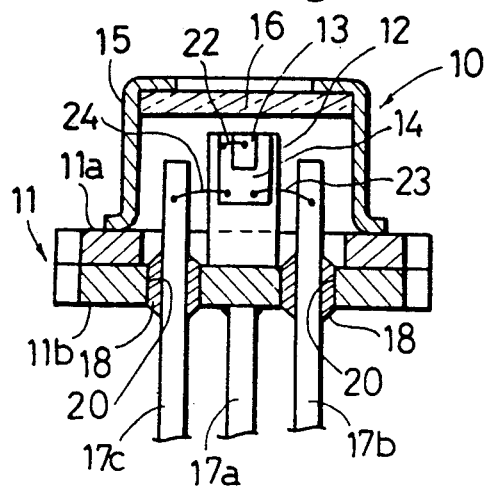
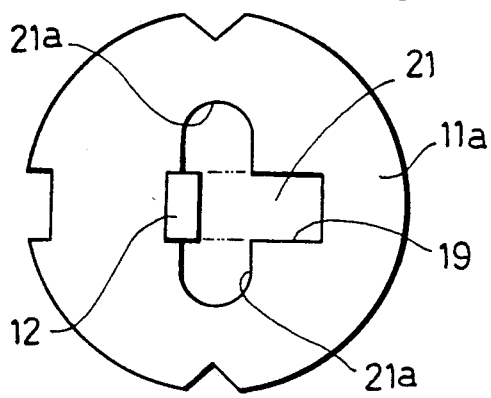
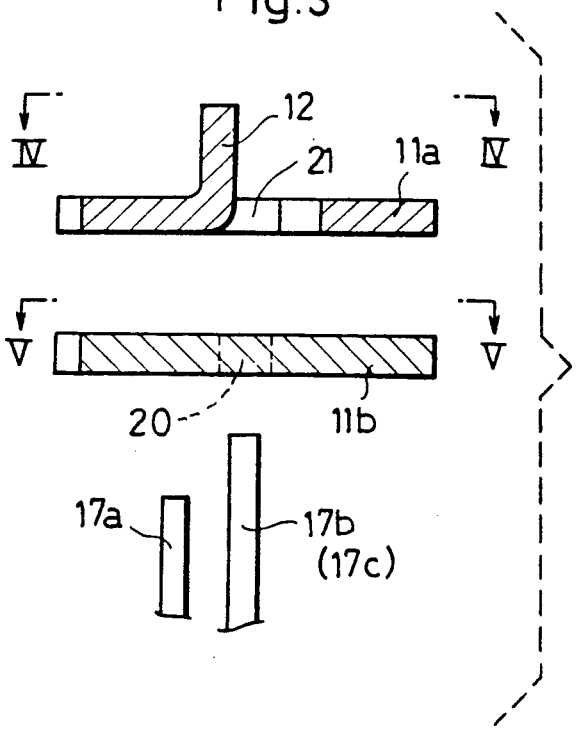
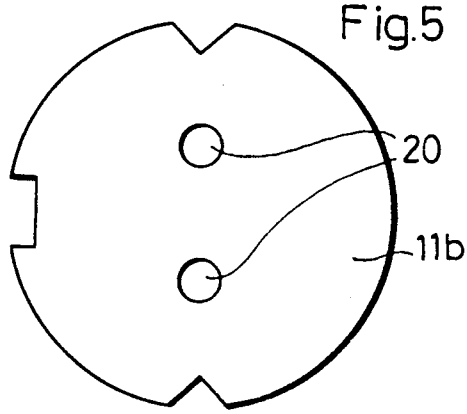

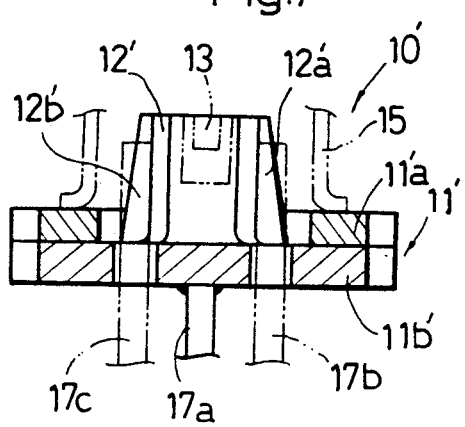
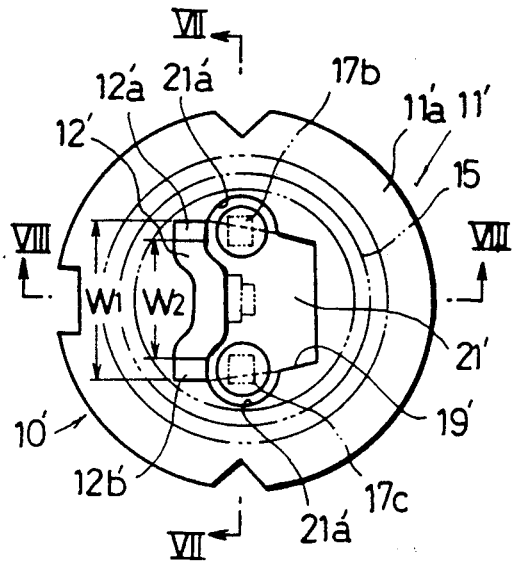
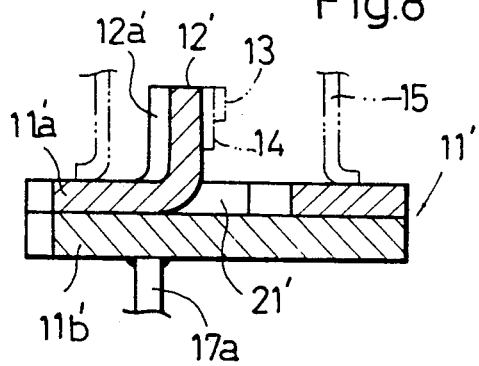
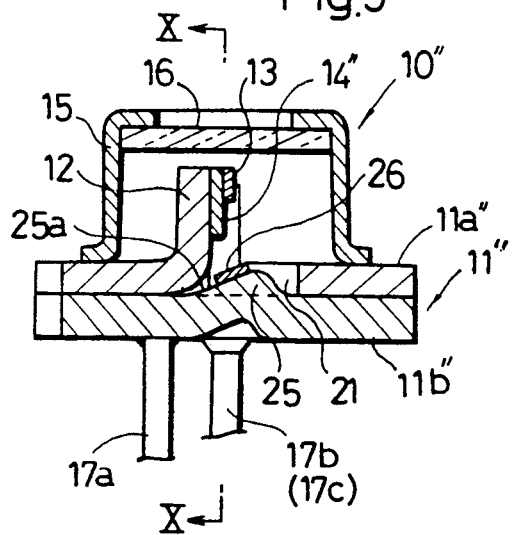
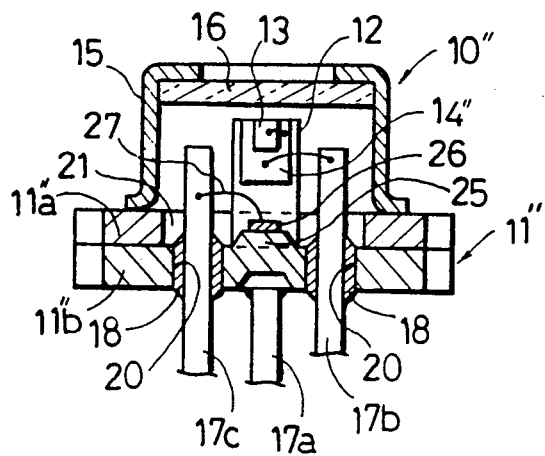

SEMICONDUCTOR LASER DEVICE WITH MOUNTING BLOCK

BACKGROUND OF THE INVENTION

1. Field of the Invention

This invention relates generally to a solid-state laser device. More particularly, the present invention relates to a semiconductor laser device which utilizes a semiconductor laser chip as a laser beam emitting element.

2. Description of the Prior Art

Various semiconductor laser devices have been heretofore proposed. One typical example of these is the one which is disclosed for example in U.S. Pat. No. 4,768,070 (Patented: Aug. 30, 1988; Applicant: Takizawa et al) or in Japanese Utility Model Application Laid-open No. 62-58066 (Laid-open: Apr. 10, 1987; Inventor: Toshiyiko Ishii).

Reference is now made to FIGS. 11 through 13 of the accompanying drawings to specifically describe the general arrangement of the typical semiconductor laser device disclosed in the above-noted U.S. patent or laid-open Japanese Utility Model application.

As shown in FIGS. 11 through 13, the typical prior art semiconductor laser device includes a discal base or stem 1 of a suitable diameter D and thickness T. The stem is provided with an upwardly directed mounting block 2 for mounting a semiconductor laser chip 3 via a semiconductor substrate (submount) 4. The discal stem is made of a metal such as carbon steel, and works dually as a support and as a heat sink.

The stem 1 is formed, near the mounting block 2, with an inclined recess 9a for arranging a laser emission monitoring photodiode 9. The underside of the stem is welded to a first lead 7a in electrical conduction therewith. Further, the stem is formed with a pair of lead inserting holes 1a, 1b to allow insertion of second and third leads 7b, 7c. The second and third leads are hermetically insulated from the stem by insulation sealant 8, such as glass, loaded into the respective lead inserting holes.

As shown in FIG. 12, the laser chip 3 is connected to the substrate 4 by a wire A, while the substrate 4 is connected to the second lead 7b by another wire B. Similarly, the third lead 7c is connected to the photodiode 9 by a further wire C.

The laser device further comprises a cap 5 having a glass window 6 and mounted to the stem 1 to encase the semiconductor laser chip 3 and its associated components. The cap is also made of a metal such as carbon steel, and hermetically attached to the stem by performing resistance welding.

In operation, when a predetermined current is passed, the semiconductor laser chip 3 generates a laser beam in the arrow direction (FIG. 11) by stimulated emission. Simultaneously, a small portion of the laser beam is emitted in the opposite direction and detected by the photodiode 9 for monitoring the laser beam emission.

According to the prior art described above, the mounting block 2 may be formed in two different methods.

Specifically, in a first method, the mounting block 2 is separately prepared, and subsequently fixed to the stem 1 by welding or brazing. However, the first method is disadvantageous in that the mounting block is likely to deviate positionally and/or angularly during the welding or brazing operation. Thus, after welding or brazing, it may be necessary to perform additional finish machining until the chip bonding surface of the mounting block 2 is located correctly relative to the center of the stem 1 and maintains exact perpendicularity relative to the stem surface, thus resulting in an unacceptable cost increase.

In a second method, the mounting block 2 is formed integrally with the stem 1 simultaneously at the time of preparing the stem by cold-forging. While improving the positional and angular accuracy of the mounting block, the second method is still disadvantageous in that cold-forging of the combined stem and mounting block requires a strong high-precision forging machine but nevertheless results in early damage of forging dies, consequently causing an unacceptable cost increase.

Further, regardless of the method of forming the mounting block 2, the mounting block 2 provides an additional weight which cannot be canceled in the prior art arrangement.

SUMMARY OF THE INVENTION

It is, therefore, an object of the present invention is to enable low-cost manufacture of a combined stem and mounting block for a semiconductor laser device.

Another object of the present invention is to decrease the combined weight of the stem and mounting block, thereby reducing the weight of the laser device as a whole.

A further object of the present invention is to enhance heat transmission from the mounting block to the stem, thereby effectively preventing an excessive temperature increase of the laser device.

According to the present invention, there is provided a semiconductor laser device comprising: a metallic stem; a cap mounted to one surface of the stem; a mounting block arranged to project from the one surface of the stem into the cap; and a semiconductor laser chip carried by the mounting block; wherein the stem comprises a first stem member located closer to the mounting block, and a second stem member laminated to the first stem member on the side thereof away from the mounting block; the first stem member being formed with a cutting line partially surrounding a portion of the first stem member; the mounting block being provided by bending the partially surrounded portion into the cap to leave a corresponding perforation in the first stem member.

With the above arrangement, the provision of the mounting block is inevitably accompanied by formation of the corresponding perforation in the first stem member. However, the perforation can be completely closed by the second stem member, so that such a perforation does not provide any sealing problem. Conversely, thanks to this perforation, the mounting block, which is originally a part of the first stem member itself, can be provided without any weight increase.

Further, since the stem has a two-layer structure, each of the respective stem members need only have a divided thickness greatly smaller than the overall thickness of the stem. Thus, each stem member may be easily formed from a thin metallic plate by a punch press. Further, the use of the press insures positional accuracy of the mounting block relative to the stem center as well as exact perpendicularity of the mounting block relative to the stem surface.

Other objects, features and advantages of the present invention will be fully understood from the following detailed description given with reference to the accompanying drawings.

BRIEF DESCRIPTION OF THE DRAWINGS

In the accompanying drawings:

FIG. 1 is a view, in vertical section, showing a semiconductor laser device according to a first embodiment of the present invention;

FIG. 2 is a sectional view taken along lines II—II in FIG. 7;

FIG. 3 is a view showing principal parts of the same laser device in an exploded condition;

FIG. 4 is a view showing a first stem member as seen in the direction of arrows IV—IV in FIG. 3;

FIG. 5 is a view showing a second stem member as seen in the direction of arrows V—V in FIG. 3;

FIG. 6 is a plan view showing a semiconductor laser device according to a second embodiment of the present invention;

FIG. 7 is a sectional view taken along lines VII—VII in FIG. 6;

FIG. 8 is a sectional view taken along lines VIII—VIII in FIG. 6;

FIG. 9 is a view, in vertical section, showing a semiconductor laser device according to a third embodiment of the present invention;

FIG. 10 is a sectional view taken along lines X—X in FIG. 9;

DETAILED DESCRIPTION OF THE PREFERRED EMBODIMENTS

Figure 11:
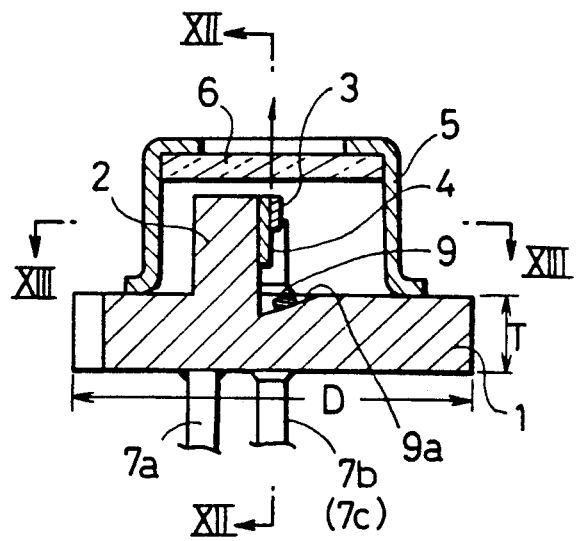
FIG. 11 is a view, in vertical section, showing a prior art semiconductor laser device.

The present invention is now described on the basis of three preferred embodiments with reference to FIGS. 1 through 10 of the accompanying drawings. It should be noted that, throughout the three different embodiments, identical parts are represented by the same reference numerals.

EMBODIMENT 1

FIGS. 1 through 5 show a semiconductor laser device according to the first embodiment of the present invention.

The laser device of this embodiment, which is generally designated by reference numeral 10, mainly includes a discal stem 11, and a cap 15 hermetically mounted on the stem. The cap has a glass window 16 for laser beam output. Both of the stem and the cap are made of a suitable metal such as carbon steel.

The stem 11 comprises a first stem member 11a, and a second stem member 11b joined to the first stem member in lamination. The first and second members equally have a diameter D and provide a combined thickness T (FIG. 1).

The first stem member 11a, which is located closer to the cap 15, is integrally provided with a generally rectangular mounting block 12 which also serves as a heat sink. According to the invention, the mounting block 12 is formed in the following manner.

As shown in FIG. 4, a cutting line 19 extending along three sides of a rectangle is formed in the first stem member 11a. Subsequently, a portion of the first stem member located inside the cutting line 19 is bent into the cap 15 perpendicularly to the plane of the first stem member (see also FIG. 3), consequently leaving a perforation 21 in the first stem member. Obviously, the bent portion of the first stem member is used as the mounting block 12.

According to the illustrated embodiment, the perforation 21 of the first stem member 11a has a pair of offset lead inserting portions 21a on both sides of the mounting block 12. These offset portions 21a may be replaced by a pair of circular holes (not shown) separate from the perforation 21.

The second stem member 11b has a pair of lead inserting holes 20 (see FIGS. 3 and 5) in corresponding relation to the offset portions 21a of the perforation 21 of the first stem member 11a. The underside of the second stem member is welded to a first lead 17a into electrical conduction therewith, whereas the respective lead inserting holes 20 allow entry of second and third leads 17b, 17c into the cap 15 with a spacing which is larger than the width of the mounting block 12. The second and third leads 17b, 17c are sealingly insulated from and fixed to the second stem member by insulation sealant 18, such as glass, loaded into the respective lead inserting holes 20, as best shown in FIG. 2.

A semiconductor substrate (submount) 14, which itself is provided with a photodiode (not shown) for laser emission monitoring according to the illustrated embodiment, is attached to one surface of the mounting block 12 of the first stem member 11a. Further, a semiconductor laser chip 13 is suitably bonded to the substrate 14 in a manner such that the optical axis of the laser chip 13 is located centrally of the cap 15.

As shown in FIG. 2, the laser chip 13 is connected to the substrate 14 by a wire 22, while the substrate 14 is connected to the second lead 17b by another wire 23. Similarly, the third lead 17c is connected to the unillustrated photodiode on the substrate 14 by a further wire 24. The respective wires 22, 23, 24 may be made of a suitable metal such as gold.

In assembly, the first and second stem members 11a, 11b, which are initially separate, may be joined together by performing resistance welding along the entire circumference of the stem 11. Similarly, the cap 15 may be hermetically joined to the first stem member 11a by resistance welding. Obviously, resistance welding between the first and second stem members 11a, 11b as well as between the first stem member 11a and the cap 15 may be performed simultaneously to shorten the time required for assembly.

With the arrangement of the laser device described above, the provision of the mounting block 12 is inevitably accompanied by formation of the corresponding perforation 21 in the first stem member 11a. However, the perforation 21 can be completely closed by the second stem member 11b, so that such a perforation does not provide any sealing problem. Indeed, thanks to this perforation, the mounting block 12, which is originally a part of the first stem member itself, can be provided without any weight increase. In the prior art semiconductor laser device, the mounting block is inevitably a weight adding part.

Further, since the stem 11 has a two-layer structure, each of the respective stem members 11a, 11b need only have a divided thickness greatly smaller than the overall thickness T of the stem. Thus, each stem member may be easily formed from a thin metallic plate by a punch press. Further, the use of the press insures positional accuracy of the mounting block 12 relative to the stem center as well as exact perpendicularity of the mounting block 12 relative to the stem surface.

EMBODIMENT

FIGS. 6 through 8 illustrate a semiconductor laser device 10' according to the second preferred embodiment of the present invention.

Similarly to the first embodiment, the laser device 10' of the second embodiment comprises a discal metallic stem 11' including a first stem member 11a' and a second stem member 11b'. The laser device also comprises other components including a cap 15 and so on. For simplicity, the second embodiment is specifically described only with respect to the points which differ from the first embodiment.

As clearly shown in FIGS. 6 through 8, the first stem member 11a' is integrally formed with a generally trapezoidal mounting block 12' which has a smaller top width W2 and a larger root width W1. Further, the first stem member also has a correspondingly shaped perforation 21' along a cutting line 11' with a pair of offset lead inserting portions 21a'.

According to the illustrated second embodiment, both the top width W2 and root width W1 of the mounting block 12' are larger than the spacing between the second and third leads 17b, 17c. Thus, in order to avoid interference with these leads, the mounting block 12' is made to have a pair of retreated lateral portions 12a', 12b'. Otherwise, the second and third leads 17b, 17c must be spaced from each other to a greater degree (as required to avoid interference with the mounting block 12'), thus necessitating the use of a diametrically larger stem which is completely against miniaturization of the laser device.

As is well known, the semiconductor laser chip 13 generates heat as a result of laser beam emission, and such heat causes a temperature increase of the laser chip. On the other hand, the temperature increase of the laser chip has been found detrimental to laser beam emission. Thus, it is necessary to discharge the generated heat from the laser chip to continue effective laser beam emission. The mounting block 12' and the stem 11' act as a heat sink to serve this purpose.

The mounting block 12' of the second embodiment is much greater in width than that of the first embodiment (see FIGS. 2 and 5). Such an enlarged mounting block is preferable in that it is capable of transmitting a larger amount of heat to the stem 11' for heat dissipation, thereby effectively preventing the laser chip 13 from temperature increase.

Obviously, the mounting block 12' may be rendered rectangular but have a width larger than the spacing between the second and third leads 17b, 17c.

EMBODIMENT 3

FIGS. 9 and 10 show a semiconductor laser device 10" according to the third embodiment of the present invention. The third embodiment differs from the first embodiment only with respect to a discal metallic stem 11" and a semiconductor substrate (submount) 14".

According the third embodiment, the substrate 14" itself is not provided with a laser emission monitoring photodiode contrary to the first embodiment. Instead, a photodiode 26 is provided on the side of the stem 11".

Specifically, the stem 11" includes a first stem member 11a" which is substantially identical to that of the first embodiment, and a second stem member 11b" which has a projection 25 directed into the perforation 21 of the first stem member. The projection 25 has an inclined mounting surface 25a for attaching the photodiode 26. The photodiode is connected to the third lead 17c through a metallic wire (e.g. gold wire) 27.

Figure 12:
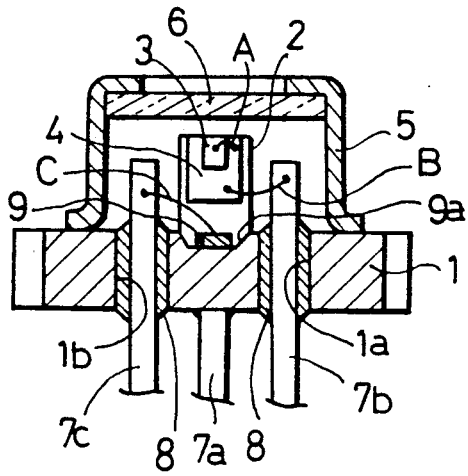
FIG. 12 is a sectional view taken along lines XII—XII in FIG. 11.
Figure 13:
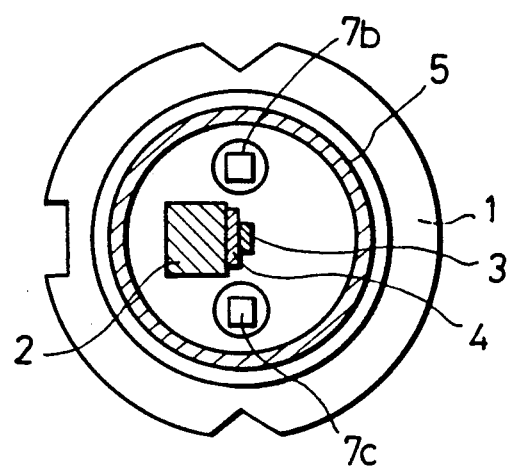
FIG. 13 is a sectional view taken along lines XIII—XIII in FIG. 11.

The projection 25 may be formed simultaneously at the time of punch-pressing the relatively thin second stem member 11b" into a predetermined shape. Thus, the formation of the projection 25 can be performed easily at a lower cost in comparison with the prior art (see FIGS. 11 through 13) wherein the inclined recess 9a must be formed in the relatively thick stem 1.

The present invention being thus described, it is obvious that the same may be varied in many ways. For instance, the stem 11, 11', 11" may not be discal. Further, the mounting block 12, 12' may not be rectangular or trapezoidal. Such variations are not to be regarded as a departure from the spirit and scope of the invention, and all such modifications as would be obvious to those skilled in the art are intended to be included within the scope of the following claims.

We claim:

1. A semiconductor laser device comprising: a metallic stem; a cap mounted to one surface of the stem; a mounting block arranged to project from said one surface of the stem into the cap; and a semiconductor laser chip carried by the mounting block; wherein:

the stem comprises a first stem member located closer to the mounting block, and a second stem member laminated to the first stem member on the side thereof away from the mounting block;

the first stem member being formed with a cutting line partially surrounding a portion of the first stem member;

the mounting block being provided by bending the partially surrounded portion into the cap to leave a corresponding perforation in the first stem member.

2. The laser device according to claim 1, further comprising a first lead connected to the second stem member, and second and third leads which are mutually spaced and insulatingly penetrate through the second stem member into the cap.

3. The laser device according to claim 2, wherein the mounting block is generally rectangular and has a width smaller than the spacing between the second and third leads.

4. The laser device according to claim 2, wherein the mounting block has a pair of lateral portions retreated to clear the second and third leads.

5. The laser device according to claim 4, wherein the mounting block has a width larger than the spacing between the second and third leads.

6. The laser device according to claim 4, wherein the mounting block is generally trapezoidal with a smaller top width and a larger root width, at least the root width of the mounting block being larger than the spacing between the second and third leads.

7. The laser device according to claim 1, wherein the second stem member has a projection directed into the perforation of the first stem member, the projection having an inclined mounting surface for mounting a laser emission monitoring photodiode.

8. The laser device according to claim 1, wherein the first and second stem members are generally discal and joined together by performing resistance welding along the entire circumference of the stem.

9. The laser device according to claim 2, wherein the perforation of the first stem member has a pair of offset lead inserting portions.

* * * * *